(12) United States Patent
Chang (10) Patent No.: US 8,870,311 B2
(45) Date of Patent: Oct. 28, 2014

(54) TRACK-BEARING CABINET FASTENER

(71) Applicant: Nan Juen International Co., Ltd., New Taipei (TW)

(72) Inventor: Fu-Tien Chang, New Taipei (TW)

(73) Assignee: Nan Juen International Co., Ltd, New Taipei (TW)

( * ) Notice: Subject to any disclaimer, the term of this patent is extended or adjusted under 35 U.S.C. 154(b) by 0 days.

(21) Appl. No.: 13/839,250

(22) Filed: Mar. 15, 2013

(65) Prior Publication Data

US 2014/0132139 A1 May 15, 2014

(30) Foreign Application Priority Data

Nov. 14, 2012 (TW) .............................. 101222021 U (51) Int. Cl.
| A47B 88/00 | (2006.01) |
| H05K 7/18 | (2006.01) |
| H05K 7/14 | (2006.01) |

(52) U.S. Cl.
CPC .............. *H05K 7/183* (2013.01); *H05K 7/1489* (2013.01)
USPC ..................................................... 312/334.4

(58) Field of Classification Search
CPC ......... A47B 88/044; A47B 96/06; H05K 7/14
USPC ................. 211/26, 187, 192, 190; 312/334.4, 312/334.8, 334.5, 334.1, 319.1, 223.1; 248/200.1, 221.11, 243, 298.1, 225.21, 248/220.41, 220.22, 205.1, 218.4, 219.1, 248/220.31, 220.43; 403/321, 324, 328

See application file for complete search history.

(56) References Cited

U.S. PATENT DOCUMENTS

| 8,235,339 | B2 * | 8/2012 | Selvidge et al. .......... 248/220.21 |
| 8,550,416 | B2 * | 10/2013 | Yu et al. ..................... 248/298.1 |
| 2008/0073469 | A1 * | 3/2008 | Mushan et al. ............. 248/205.1 |
| 2008/0304903 | A1 * | 12/2008 | Huang ........................... 403/230 |
| 2009/0250421 | A1 * | 10/2009 | Wang et al. ................... 211/183 |
| 2010/0187960 | A1 * | 7/2010 | Liang ......................... 312/334.1 |
| 2010/0327135 | A1 * | 12/2010 | Selvidge et al. ......... 248/221.11 |
| 2012/0134743 | A1 * | 5/2012 | Yu et al. ........................ 403/330 |
| 2012/0193489 | A1 * | 8/2012 | Yu et al. ........................ 248/201 |
| 2012/0292274 | A1 * | 11/2012 | Lin et al. .................... 211/86.01 |
| 2012/0292928 | A1 | 11/2012 | Chang et al. |

* cited by examiner

*Primary Examiner* — Matthew Ing
*Assistant Examiner* — Hiwot Tefera
(74) *Attorney, Agent, or Firm* — Muncy, Geissler, Olds & Lowe, P.C.

(57) ABSTRACT

A track-bearing cabinet fastener having: a track holder with a baseplate; a clamping device provided with (a) a clamping box which is securely fixed at the baseplate for development of an accommodating space inside and has through slots at both top and bottom sides through which the accommodating space is accessed and two ports at its front side, one of which abuts a hook piece, (b) a clamping block which is held in the accommodating space and resisted by springs and has two protruded resisting parts located at its front side and corresponding to the ports, and (c) a clamping plug securely fixed behind the clamping box and the clamping block and closely contacting the springs by which the protruded resisting parts extend into the ports. As such, the track holder can be assembled, positioned and operated easily and safely.

9 Claims, 8 Drawing Sheets

FIG. 8

TRACK-BEARING CABINET FASTENER

BACKGROUND OF THE INVENTION

1. Field of the Invention

The present invention is a cabinet fastener, particularly a track-bearing cabinet fastener which is integrated with a cabinet rack, installed at flexible positions, conveniently disassembled, and easily and exactly operated.

2. Description of the Related Art

Figure 1:
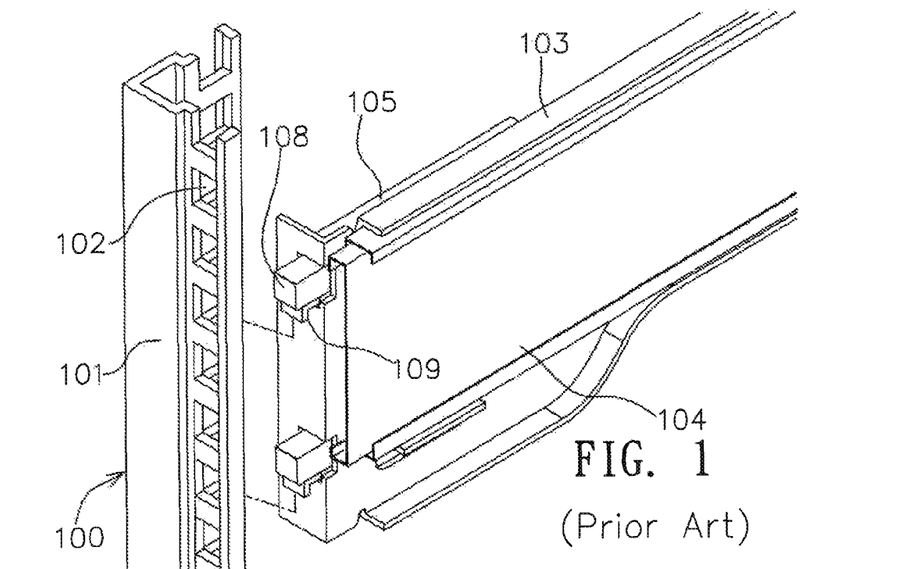
FIG. 1 is a schematic perspective view of a conventional device.
Figure 1A:
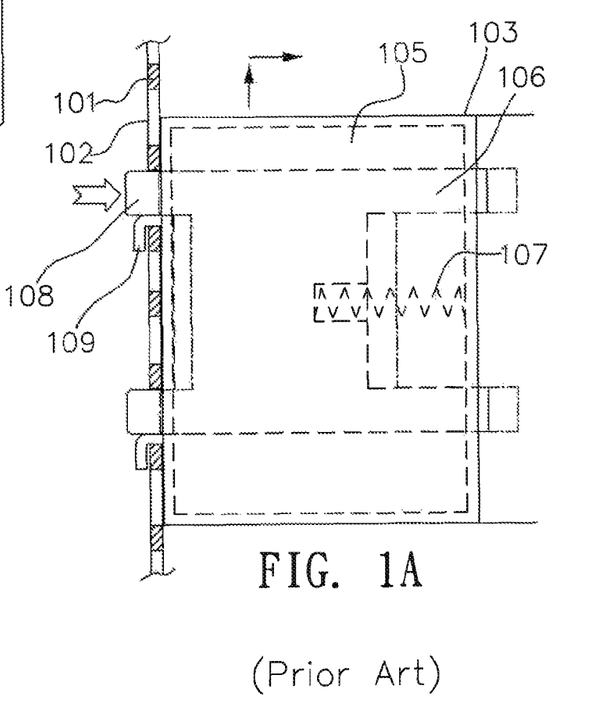
FIG. 1A is a schematic sectional view of a conventional device.

In general, a number of electronic devices (e.g., rugged computer, etc.) are concentrated and installed in a conventional cabinet. As shown in FIGS. 1 and 1A, the conventional cabinet can be a rack 100 with four right-angled supports 101 at its front and back wherein each of the supports 101 comprises longitudinally arranged rabbets 102 corresponding to each other. The rabbets 102 can join a track holder 103 on which there is a track assembly 104 consisting of (a) a bottom track fixed at the track holder 103 and (b) an inner track separated from the bottom track's one side and connected to an electronic device (not shown in figures); the track holder 103 is protected by a shield body 105 from its front to back in which a slide block 106 is held; the slide block 106 has one side with a central recess resisted by a spring 107, which allows its one end to be fixed at an inner lateral of the shield body 105, and other side with tenons 108, which protrudes from the shield body 105 and are normally held in the rabbets 102 under compression of the spring 107; the track holder 103 is provided with claspers 109 which are near the tenons 108 and held in the rabbets 102 to prevent tenons 108 being separated from the rabbets 102. As previously mentioned, this mechanism restricted to specifications of electronic devices to be installed is not an ideal design due to some factors as follows: more materials consumed, difficulties in manufacturing, both hands required for operation, and claspers being easily jammed.

Figure 2:
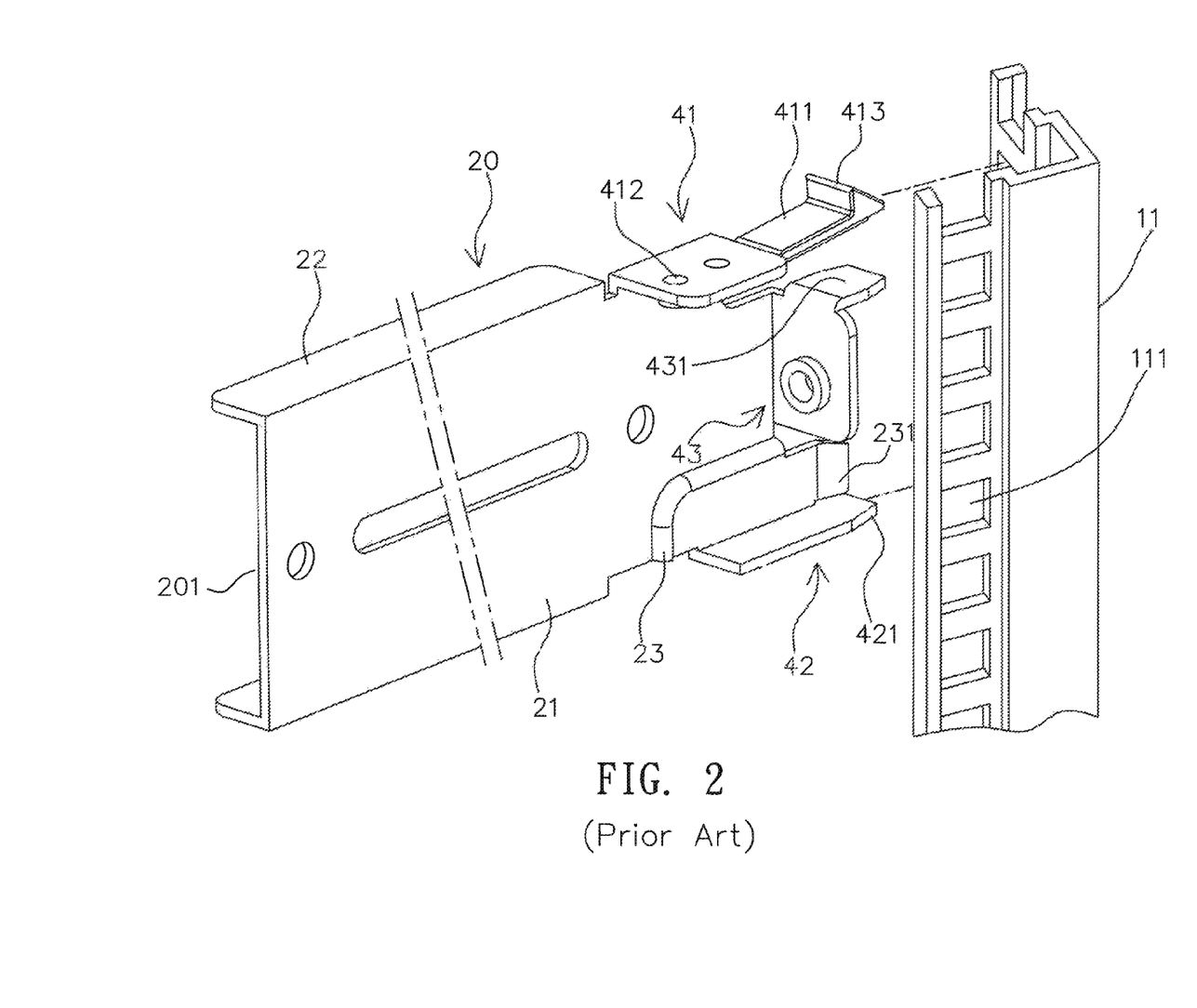
FIG. 2 is a further schematic perspective view of a conventional device.

In virtue of drawbacks in the prior art for any device installed on a cabinet, other newer techniques such as that of R.O.C. Patent Number M399583 have been developed. Referring to FIG. 2 which illustrates one device installed on supports 11 at the front and back of a rack (see patent specification of M399583, similarly hereinafter). This art features at least a track holder 20 which is held on the support 11 and comprises a baseplate 21 with right-angled bending edges 22 located at upper and lower ends and extending toward a same direction for development of an accommodation space 201 surrounding by the bending edges 22 and the baseplate 21. The accommodation space 201 is prepared for holding one end of a track assembly; the baseplate 21 comprises a first fastener 41 and a second fastener 42 which are opposite to each other and situated at upper and lower ends of the baseplate 21, respectively. The first fastener 41 further comprises a hook piece 411 at its front which is bended and deformed under effect of any external force and resumes its original poise with the external force removed. The hook piece 411 joins the first fastener 41 by means of a joining member 412 and comprises a reverse hook 413 at its front. The bended first fastener 41 and second fastener 42, which are perpendicular to the baseplate 21, extend along one direction contrary to that of the bending edge 22, wherein the second fastener 42 comprises a tenon 421 at its front end. The baseplate 21 further comprises (a) a convex plane 23 which is near the second fastener 42 and also has a front tenon 231 and (b) a third fastener 43 at its front end with a tongue-shaped plate 431 extending outward.

However, the prior art, i.e., Patent Number M399583, which is in favor of installation of devices still deserves to be corrected because a user has to strenuously press the reverse hook 413 to remove the track holder 20 supported by the flaky hook piece 411, tongue-shaped plate 431 and the tenon 421, all of which provide weaker holding power, are prone to deformation, and complicate reinstallation and safety.

Accordingly, the inventor having considered imperfect structural design and drawbacks of the prior art and attempted to optimize a solution, that is, a track-bearing cabinet fastener easily and securely operated, installed and fixed, has studied and developed the present invention for promoting development of the industry.

SUMMARY OF THE INVENTION

The present invention is intended for providing a track-bearing cabinet fastener used in a rack on which electronic devices such as rugged computer are installed and featuring more advantages, for instance, track holder easily and safely assembled, positioned, replaced, removed and fixed and superior serviceability and efficiency.

In order to realize the above purposes, the present invention is based on technical measures comprising: a track holder with a baseplate; a clamping device which further comprises (a) a clamping box fixed at the baseplate and comprising an accommodating space inside, two through slots which link the accommodating space, two ports at its front, and a hook piece near one of the ports, (b) a clamping block held in the accommodating space, resisted by a spring, and comprising two protruded resisting parts located at its two front sides and corresponding to the ports, two push-out plates at two ends which extend beyond the clamping box, and (c) a clamping plug securely fixed behind the clamping box and the clamping block and resisting the springs which contact the clamping block and make the protruded resisting parts extend beyond the ports.

For technical features and effects in terms of the present disclosure completely comprehended and recognized, the preferred embodiments and accompanying drawings are thoroughly described hereinafter.

DETAILED DESCRIPTION OF THE PREFERRED EMBODIMENTS

Figure 3:
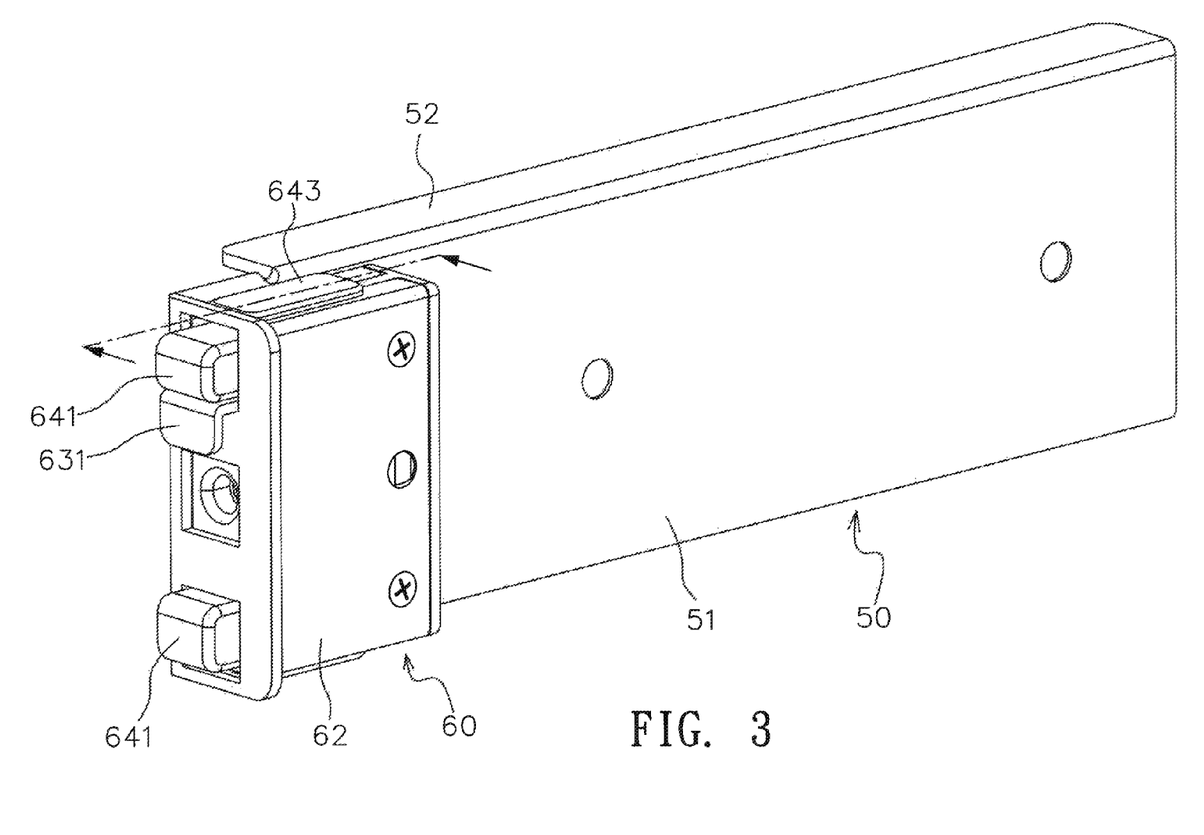
FIG. 3 is a schematic perspective view of the present invention which is assembled.
Figure 4:
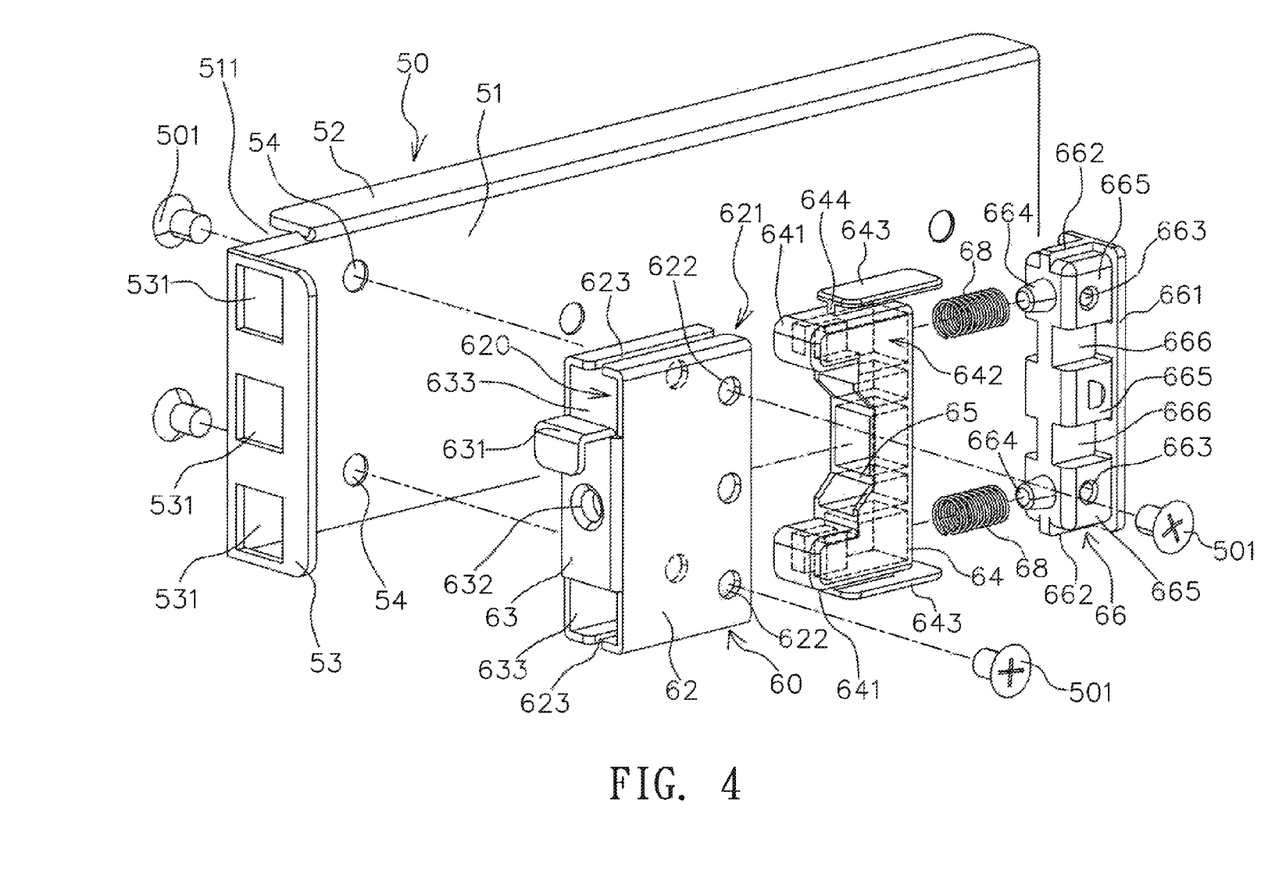
FIG. 4 is a schematic exploded view of the present invention.
Figure 5:
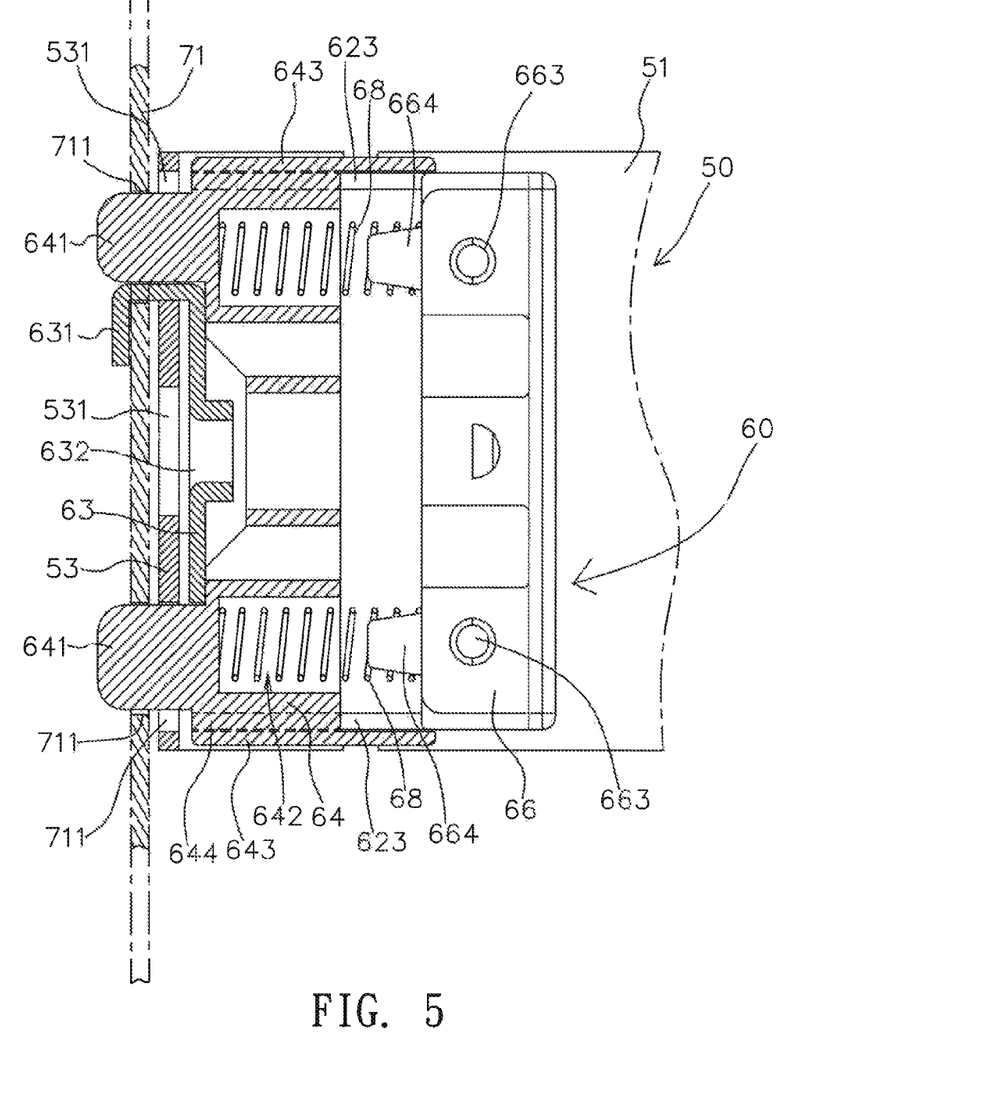
FIG. 5 is a sectional view of the present invention which is assembled.

Referring to FIG. 3 through FIG. 5 which illustrate the present invention of a track-bearing cabinet fastener comprises at least a track holder 50 and a clamping device 60. The track holder 50 is provided with a baseplate 51 comprising two bending edges 52 situated at upper and lower ends and vertically folded to a same direction (a U-shaped baseplate in this embodiment): the bending edges 52 and the baseplate 51 collectively develop an accommodation space 511 used to hold at least one end of a track assembly 72 (FIG. 8) by which an electronic device (not shown in figures) can be dragged; the baseplate 51 on which a plurality of pilot holes 54 are opened has a locking plate 53 situated at a front end and vertical to the baseplate 51; the locking plate 53 has at least two through holes 531, preferably three square through holes 531 in this embodiment.

The clamping device 60 comprises a clamping box 62, a clamping block 64 and a clamping plug 66. The clamping box 62 is a hollow shell body for development of an accommodating space 620 inside which leads to an opening 621 situated at a rear end of the clamping box 62 for holding both the clamping block 64 and the clamping plug 66; the clamping box 62 has a plurality of pilot holes 622 thereon through which the accommodating space 620 is accessed and both the clamping box 62 and the baseplate 51 are coupled to each other with screws 501 tightened on the pilot holes 622, 54; the clamping box 62 further comprises (a) through slots 623 at both top and bottom sides which access the accommodating space 620, (b) a front plate 63 at its front side, and (c) ports 633 at both ends of the front plate 63 which is a partial cover plate centrally with a central through hole 632 and an L-shaped hook piece 631 abutting one of the ports 633. The clamping block 64 held in the accommodating space 620 inside the clamping box 62 comprises (a) protruded resisting parts 641 at two ends of its front side, and each of the resisting parts 641 is corresponding to the port 633 in the clamping box 62, (b) holding cavities 642 behind the protruded resisting parts 641 to accommodate springs 68 which resiliently drive the protruded resisting parts 641 to protrude from the ports 633, and (c) push-out plates 643 at both top and bottom sides that join the clamping block 64 laterally by means of ribbed joints 644 so that the push-out plates 643 extend beyond the clamping block 64; each of the ribbed joints 644 is embedded into the through slot 623 on the clamping box 62 during assembly for relative sliding movement, as such the push-out plates 643 extend and locate outside of the clamping box 62; the clamping block 64 is centrally provided with a number of clapboards 65 by which the clamping block 64 is partitioned into a number of penetrable spaces. The clamping plug 66, which is securely held behind the accommodating space 620 of the clamping box 62 and the clamping block 64, is provided with a encasing plate 661 at its back side and raised side ribs 662 at both top and bottom ends: the encasing plate 661 is used to encase the accommodating space 620 in the clamping box 62; the side ribs 662 joining the encasing plate 661 are embedded into the through slots 623 on the clamping box 62. As shown in FIG. 4, the clamping plug 66 develops to be three resisting blocks 665 and two recess parts 666 in general: each of the resisting blocks 665 at both top and bottom ends of said clamping plug 66 comprises a spring stopper 664 at its front side, which is used to locate the spring 68, and two pilot holes 663 laterally, which align the pilot holes 622 for penetrations of screws 501 and combination of the clamping plug 66 as well as the clamping box 62.

As previously mentioned, the clamping device 60 which is securely fixed at the locking plate 53 of the baseplate 51 allows one of the protruded resisting parts 641 as well as the hook piece 631 to extend into the corresponding through hole 531 and the other of the protruded resisting parts 641 to extend into the other corresponding through hole 531 for assembly of the clamping device 60 and the track holder 50.

Figure 8:
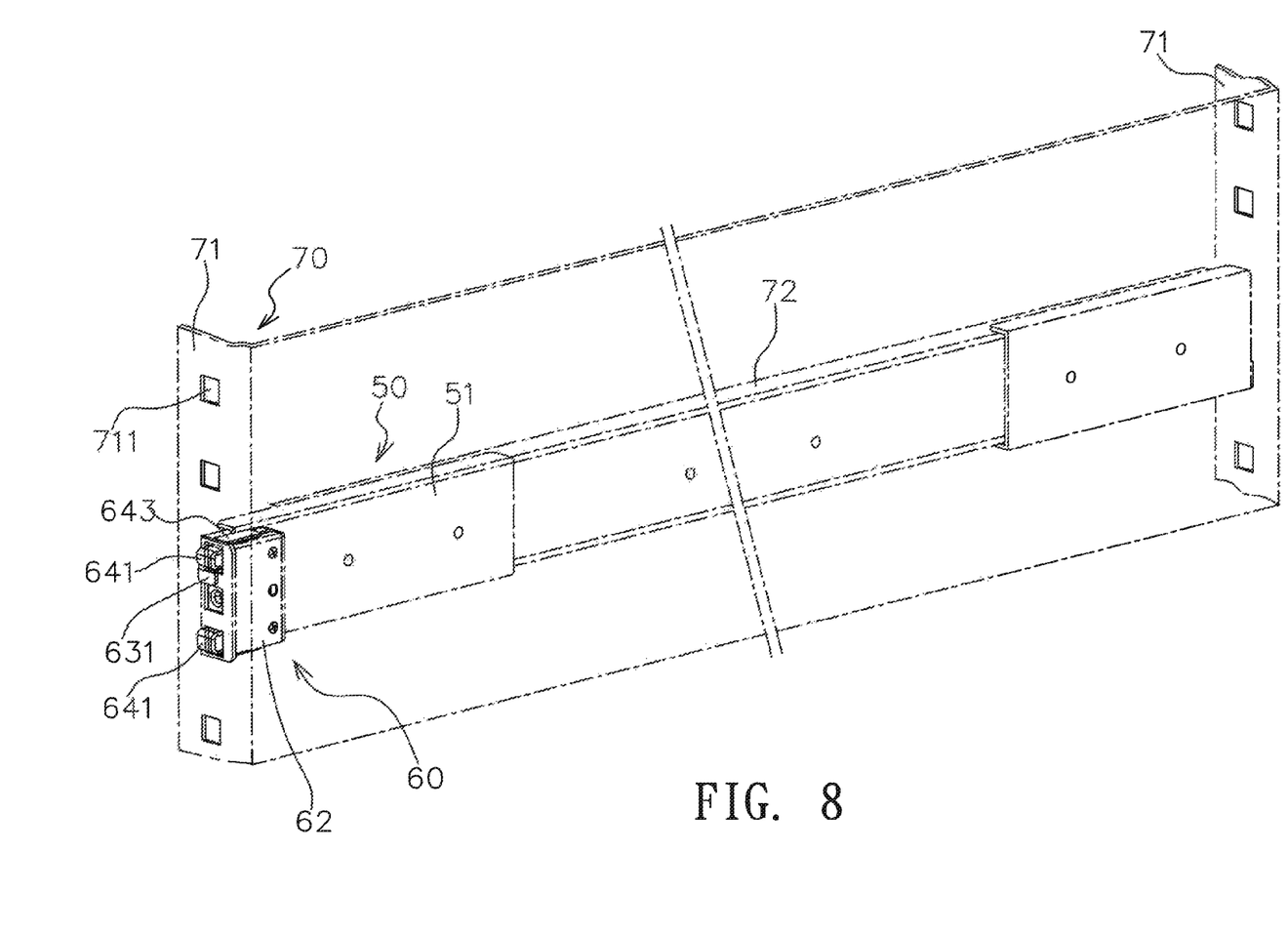
FIG. 8 is a schematic view of the present invention which is assembled.

Referring to FIGS. 5 and 8 which illustrate the present invention of a track-bearing cabinet fastener is assembled onto a rack 70 with two vertically opposite supports 71 at both lateral sides on which there are longitudinally arranged rabbets 711 corresponding to each other for combination of the clamping device 60, that is, the protruded resisting part 641 and the hook piece 631 at one end as well as the other protruded resisting part 641 at the other end extend and are held in but not separated from the corresponding rabbets 711 under effect of the hook piece 631. Moreover, the clamping block 64 which is always resisted by the springs 68 under effect of elasticity ensures the clamping device 60 (track holder 50) is securely fixed at the rack 70 because both the protruded resisting parts 641 and the hook piece 631 are not separated or dropped from the rabbets 711 with no external force applied.

Figure 6:
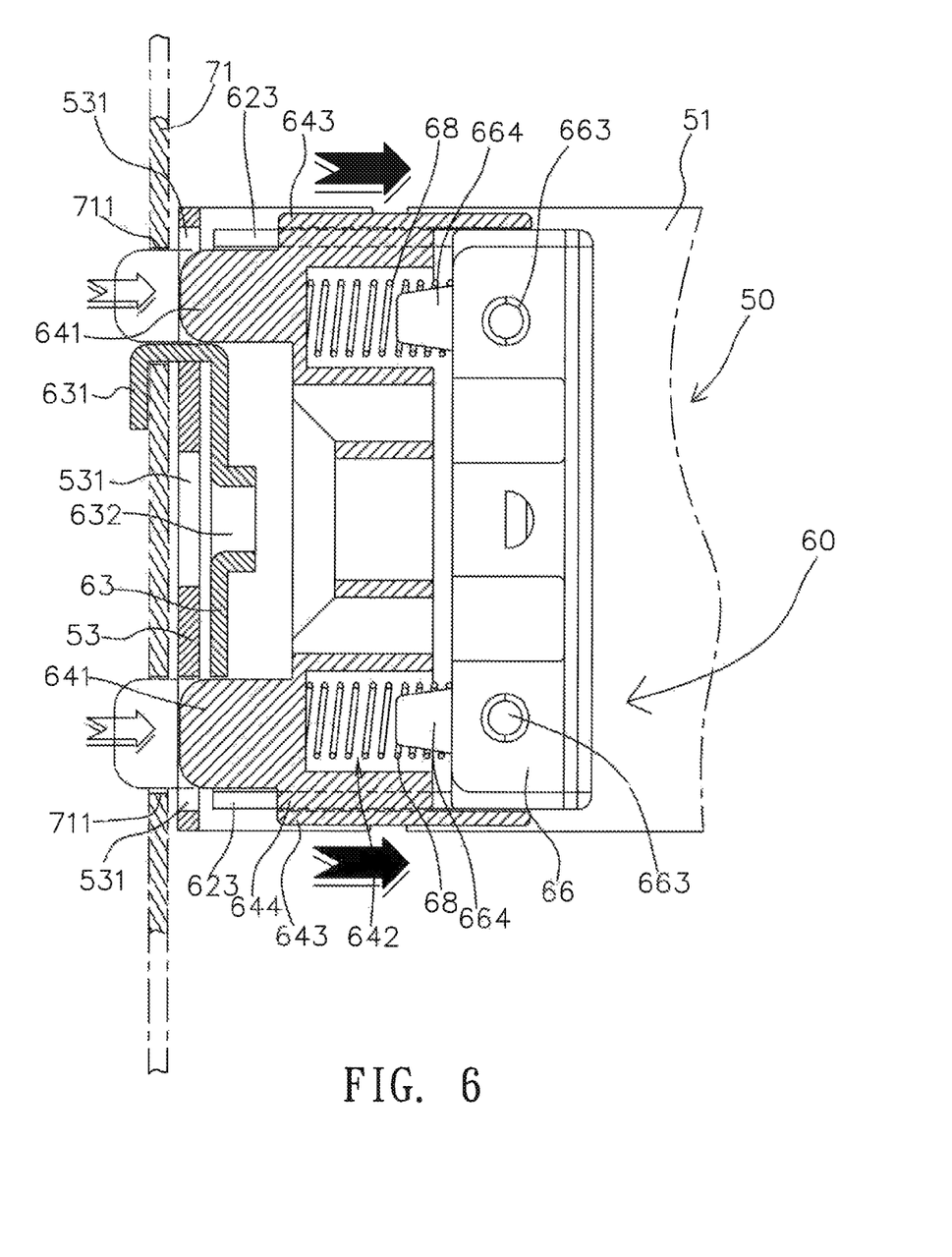
FIG. 6 is a first schematic view of the present invention which is being disassembled.
Figure 7:
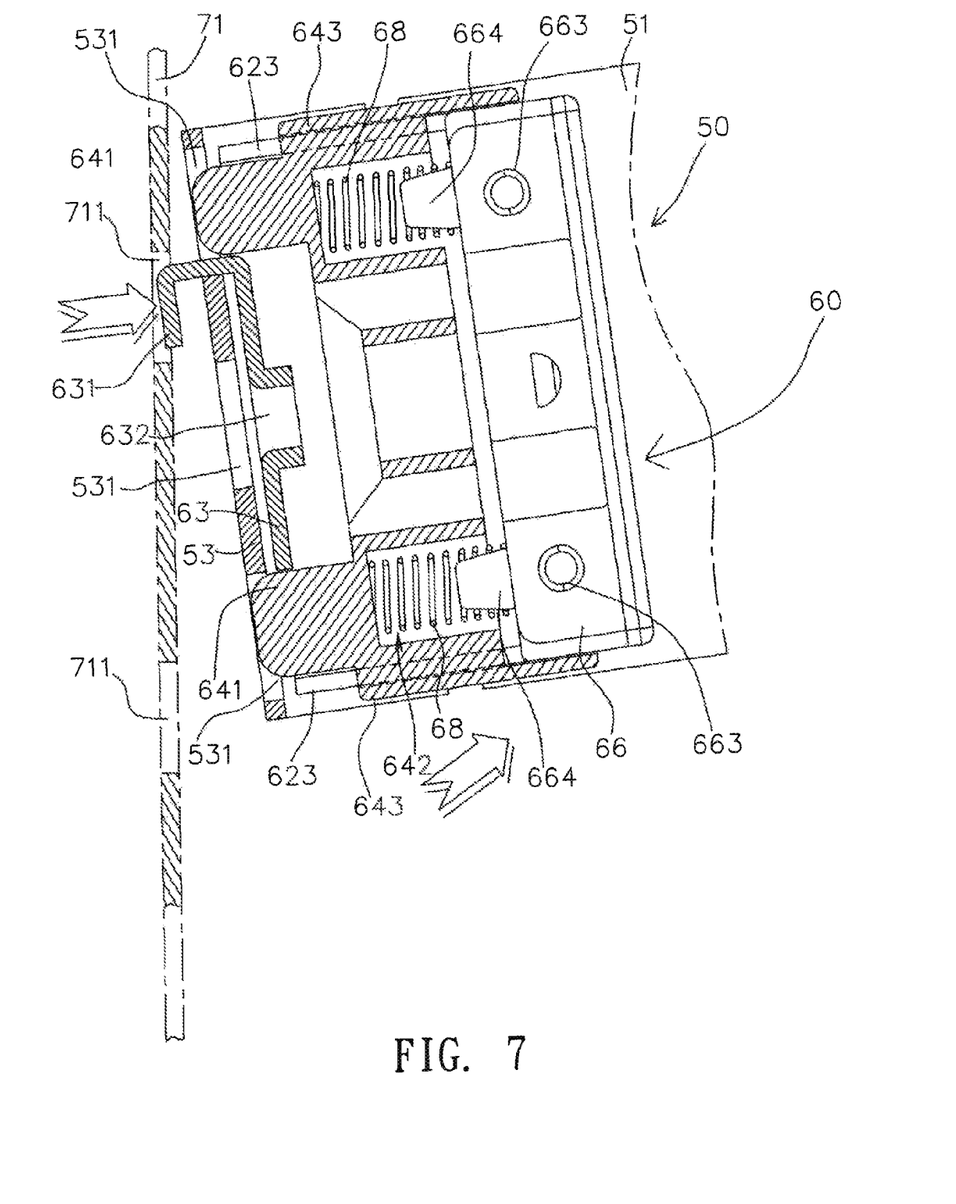
FIG. 7 is a second schematic view of the present invention which is being disassembled.

Referring to FIGS. 6 and 7 which illustrates the track holder 50 to be disassembled: the push-out plates 643 are pushed backward by a single hand and drive the protruded resisting parts 641 (clamping block 64) to move backward synchronously, separating the protruded resisting parts 641 from the rabbets 711 (FIG. 6); and then the clamping device 60 (track holder 50) is lifted and dragged backward, as such the hook piece 631 is lifted accordingly; and the clamping device 60 (track holder 50) is further tilted, turned to an angle in order to make the two protruded resisting parts 641 and the hook piece 631 to be easily withdrawn from the rabbets 711. Finally, the pushed push-out plates 643 are released and the springs 68, which have been compressed accordingly while the push-out plates 643 is pushed, resume the protruded resisting parts 641 (clamping block 64) to its original position with its elastic energy.

The present invention of a track-bearing cabinet fastener features both the clamping device designed as easily operated workpiece and the track holder simply and safely assembled/disassembled, positioned, fixed or replaced and has superior serviceability and efficiency.

Therefore, the present invention significantly meets patentability and is applied for the patent. However, the above descriptions are only preferred embodiments which do not limit the scope of the present invention; any equivalent change or improvement without departing from spirit of the present invention should be incorporated in claims herein.

What is claimed is:

1. A track-bearing cabinet fastener, comprising:
    a track holder with a baseplate;
    a clamping device which further comprises:
        a clamping box being a hollow shell with an accommodating space formed inside of said hollow shell, said clamping box being fixed at said baseplate and further comprising (a) through slots at both top and bottom sides of said clamping box, and said accommodating space is accessed through said through slots, (b) ports at both ends of a front sides of said clamping box, and (c) a hook piece near one of said ports;
        a clamping block held in said accommodating space, resisted by springs, and comprising (a) two protruded resisting parts at front side of said clamping block, and each of said two protruded resisting parts is corresponding to one of said ports, and (b) two push-out plates at both top and bottom side of said clamping block and said two push-out plates extended beyond and located outside of said clamping box and each of said push-out plates joins said clamping block by means of a ribbed joint embedded into one of said through slots of said clamping box; and each of said push-out plate is further extended behind said clamping block;

a clamping plug securely fixed behind said clamping box and said clamping block, and closely contacting said springs by which said clamping block is resisted and said protruded resisting parts extend into said ports, said clamping plug held in said accommodating space of said clamping box is provided with an encasing plate at back side and a raised side rib at both top and bottom sides: said encasing plate is used to encase said accommodating space in said clamping box; said raised side ribs joining said encasing plate are embedded into said through slots of said clamping box.

2. The track-bearing cabinet fastener according to claim 1 wherein said baseplate has (a) two bending edges, which are situated at upper and lower ends and vertically folded toward a same direction for development of an accommodation space surrounded by said bending edges and said baseplate, (b) a plurality of pilot holes corresponding to a plurality of pilot holes of said clamping box, and (c) a locking plate at its front on which at least two through holes are designed.

3. The track-bearing cabinet fastener according to claim 1 wherein an opening is situated at a rear end of said clamping box; and a front plate is located between said two ports and comprising a through hole centrally.

4. The track-bearing cabinet fastener according to claim 1 wherein said hook piece is an L-shaped hook piece and said clamping block has holding cavities behind said protruded resisting parts for accommodating said springs.

5. The track-bearing cabinet fastener according to claim 1 wherein said clamping block is provided with a number of clapboards centrally by which said clamping box is partitioned into some penetrable spaces.

6. The track-bearing cabinet fastener according to claim 1 wherein said clamping plug comprises three resisting blocks and two recess parts: each of said resisting blocks at both ends of said clamping plug is provided with a spring stopper at its front side, and said spring stopper is used to locate one of said springs.

7. The track-bearing cabinet fastener according to claim 6 wherein said clamping box is provided with a plurality of pilot holes which correspond to those of said resisting blocks at both ends of said clamping plug.

8. The track-bearing cabinet fastener according to claim 2 wherein one of said protruded resisting parts and said hook piece correspondingly extend into one of said at least two through holes.

9. The track-bearing cabinet fastener according to claim 1 is assembled onto a rack with two vertically opposite supports at both ends of one side of said rack on which there are longitudinally arranged rabbets corresponding to each other so that said protruded resisting part and said hook piece at one side and said other protruded resisting part at the other side extend and are correspondingly held in one of said rabbets respectively.

* * * * *